United States Patent
Kuang et al.

(10) Patent No.: US 7,142,015 B2
(45) Date of Patent: Nov. 28, 2006

(54) FAST TURN-OFF CIRCUIT FOR CONTROLLING LEAKAGE

(75) Inventors: Jente Benedict Kuang, Austin, TX (US); Hung Cai Ngo, Austin, TX (US); Kevin John Nowka, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 10/948,444

(22) Filed: Sep. 23, 2004

(65) Prior Publication Data

US 2006/0061388 A1    Mar. 23, 2006

(51) Int. Cl.
*H03K 19/0175* (2006.01)
*H03K 19/094* (2006.01)
*H03K 19/003* (2006.01)
*H03K 17/16* (2006.01)

(52) U.S. Cl. .................... 326/81; 326/27; 326/80; 326/86

(58) Field of Classification Search ............ 326/26–27, 326/80–83, 86
See application file for complete search history.

(56) References Cited

U.S. PATENT DOCUMENTS

| | | | | |
|---|---|---|---|---|
| 4,779,013 A | * | 10/1988 | Tanaka | 326/27 |
| 5,166,555 A | * | 11/1992 | Kano | 326/87 |
| 6,512,394 B1 | * | 1/2003 | Parris | 326/34 |
| 6,696,865 B1 | * | 2/2004 | Horiguchi et al. | 326/121 |
| 6,859,064 B1 | * | 2/2005 | Maangat | 326/30 |
| 6,924,669 B1 | * | 8/2005 | Itoh et al. | 326/87 |
| 6,980,018 B1 | * | 12/2005 | Ngo et al. | 326/26 |

* cited by examiner

*Primary Examiner*—James Cho
*Assistant Examiner*—Jason Crawford
(74) *Attorney, Agent, or Firm*—Jason W. Deats; Winstead Sechrest & Minick P.C.

(57) ABSTRACT

A buffer, logic circuit, and data processing system employing fast turn-off drive circuitry for reducing leakage. Leakage current in logic circuitry is managed by coupling and decoupling the voltage potentials applied to large, high-leakage devices. Circuitry includes a low leakage logic path for holding logic states of an output after turning off high-leakage devices. A fast turn-off logic path in parallel with the low leakage logic path is used to assert each logic state in the forward direction from input to output. The large output device in each fast turn-off path is relieved of leakage stress by asserting logic states at driver inputs that cause the driver to turn OFF after the output logic state has been asserted.

12 Claims, 5 Drawing Sheets

FAST TURN-OFF CIRCUIT FOR CONTROLLING LEAKAGE

GOVERNMENT RIGHTS

This invention was made with Government support under NBCH30390004 awarded by PERCS. THE GOVERNMENT HAS CERTAIN RIGHTS IN THIS INVENTION.

CROSS-REFERENCE TO RELATED APPLICATIONS

The present invention is related to the following U.S. Patent Applications which are incorporated herein by reference:

Ser. No. 10/916,980 entitled "Circuit for Controlling Leakage," filed on Aug. 12, 2004.

TECHNICAL FIELD

The present invention relates in general to complementary metal oxide semiconductor (CMOS) circuits and, in particular, to circuit methodologies for reducing leakage in sub-100 nm technologies.

BACKGROUND INFORMATION

Oxide tunneling current in metal oxide semiconductor (MOS) field effect transistors (FET) is a non-negligible component of power consumption as gate oxides get thinner, and may in the future become the dominant leakage mechanism in sub-100 nm complementary MOS (CMOS) circuits. The gate current is dependent on various conditions for a single transistor. There are three main static regions of operation for a MOSFET, and the amount of gate-leakage current differs by several orders of magnitude for each region. Whether a transistor leaks significantly is also affected by its position in relation to other transistors within a CMOS circuit because a transistor's position affects the voltage stress to which the transistor is subjected.

The three regions of operation are a function of applied bias if one only considers the parameters that affect the magnitude of gate current in a MOSFET as it operates in relation to other MOSFETs. Assuming that the supply voltage (Vdd) and the threshold voltage (Vt) are fixed, then a MOSFET in a static CMOS logic gate operates in one of three regions, each with a significantly different amount of gate leakage.

The first region of operation is called "strong inversion" and is the region in which a MOSFET operates with the absolute value of the gate to source voltage (|VGS|) equal to Vdd. The gate-leakage current density for an N-channel FET (NFET) in strong inversion may be as high as 1000 amperes per square centimeter ($A/cm^2$) for an oxide thickness of 1.5 nanometers (nm) at Vdd equal to 3 volts (V). For such a thin oxide, a more realistic value for Vdd is 1.2 V, in which case the gate-leakage current would more likely be 20 $A/cm^2$.

The second region of operation is called the "threshold" region in which |VGS|=Vt. A MOSFET operating in the threshold region will leak significantly less than a MOSFET operating in the strong inversion region—typically 3 to 6 orders of magnitude less, depending on Vdd and the oxide thickness.

The third region is called the "OFF" region where |VGS|=0.0 V. For an NFET operating in the OFF region, there is no leakage if the drain voltage (Vd)=0.0 V. However, if Vd is equal to Vdd, then a small leakage current in the reverse direction (drain to gate) may be present due to the gate-drain overlap area. This leakage current depends on transistor geometry and is typically 10 orders of magnitude less than the gate-leakage current in the strong inversion region.

The above three regions of operation represent three distinct conditions or states for the channel of a MOSFET. Whether an "ON" transistor operates at strong inversion or at threshold is determined by its position inside a logic circuit structure as well as by the state of other transistors in the circuit.

Both N-channel FETS (NFETS) and P-channel FETs (PFETs) operate in one of the three regions described above. However, the main tunneling current in a PFET device in strong inversion is due to hole tunneling from the valence band. On the other hand, the main tunneling current in an NFET device in strong inversion is due to electron tunneling from the conduction band. Therefore, PFET gate currents are about 10 times smaller than equivalently sized NFET devices. This size difference is important in assessing gate-leakage in a static CMOS circuit.

Since gate leakage currents are measured as current density, it follows that the gate-leakage current in a MOSFET is directly proportional to the gate area (width times length). Therefore, transistor sizing has a direct impact on the amount of gate-leakage in a CMOS logic circuit.

As CMOS circuits become smaller, leakage current that results when voltage is applied to the gate of a FET becomes a significant portion of the power dissipation. Leakage power may become the limiting factor in how small devices may be manufactured. As devices are made smaller, the power supply voltage is correspondingly reduced. However, reducing power supply voltage may not achieve an adequate reduction in leakage power dissipation. Alternate techniques may be employed to reduce leakage power. One popular technique is to use power-gating to isolate the power supply voltage in groups of circuits at controlled times. These circuits are sometimes referred to as being part of a power-gated domain. Other circuits may be evaluating a logic function and may not be in a power-gated domain. Interfacing between circuits in a power-gated domain and circuits in a non-power-gated domain may prove difficult. The state of an output from a power-gated domain may be uncertain during the time period of power-gating. While many benefits of power-gating are known, there is no consensus on strategies to preserve logic states of outputs in the power-gated domains. Since power-gated domains may be variable, the method of preserving output logic states from circuits in a power-gated domain are controlled by the power-gating control signals themselves.

A CMOS buffer's capability to drive current depends on the channel size of devices used to drive outputs or to drive many other logic gate inputs. Therefore, one would expect the large devices to exhibit large gate-leakage current when the technology has gate oxides that are very thin. Likewise, circuit regions with a high number of logic gates may exhibit a large gate-leakage current due to the large number of devices that are in strong inversion (between clock transitions). Logic regions with a high number of logic gates may employ power supply gating whereby the power to the logic devices are decoupled by the action of MOSFETs or PFETs for the positive power supply voltage and decoupled by the action of NFETs for the negative power supply voltage. These regions where power supply gating is employed are sometimes referred to as "cuttable" regions. When a cuttable region is interfaced with a non-cuttable region, then logic states at the interface outputs may become indeterminate when power is decoupled.

By providing feedback from the output of a power-gated or cuttable circuit, the circuit can be automatically power-gated after the output logic state has been established. This may be done by gating the stage that provides the drive to the power-gated output device with the proper phase of the output. To reduce leakage, sometimes it is desirable to control the time from when a logic state is asserted on the output until power-gating is activated. Allowing time between the assertion of an output logic state and power-gating enables the use of smaller device sizes. Some power-gating control circuits rely on elements within the control circuits to collapse from leakage through control circuit elements. In some instances, it may be desirable to turn off the drive stage more quickly, without waiting for control circuit elements to collapse through leakage.

Therefore, there is a need for a circuit design for low leakage circuits that enables automatic decoupling of leakage stressed devices quickly, without waiting on control circuits to collapse through leakage.

SUMMARY OF THE INVENTION

The present invention addresses this need by providing buffers, logic circuits, and data processing systems that utilize fast turn-off control elements to reduce leakage by quickly turning off high-leakage drive elements.

The buffer has an input node for receiving a first input signal. The voltage level of the first input signal alternates between voltage levels specified for logic one and logic zero. The buffer has a first output means for providing enhanced current drive at an output node when the first output means is ON. The buffer has a first control means for alternately turning the first output means ON and OFF. The first control means is coupled to the input node. The first control means turns the first output means ON in response to a voltage level transition applied to the input node. The first control means alternately turns the first output means ON and OFF. The first control means turns the output means ON in response to a voltage level transition at the input node. The first control means turns the first output means OFF in response to a feedback signal from the output node. The buffer also comprises a low-leakage keeper means, which could be any means for maintaining the logic one voltage level at the output node. The keeper means is coupled to both the input node and the output node. The keeper means maintains the logic one voltage level at the output node upon the turning OFF of the first output means. When the first output means is ON, it provides enhanced current drive at the output node.

Another embodiment of the invention is a buffer with a second output means for providing a voltage level representing logic zero at the output node. The second output mean provides enhanced current drive at the output node when the second output means is turned ON. The buffer has a second control means for alternately turning this second output means ON. The second control means is coupled to the input node and turns the second output means ON in response to a voltage level transition at the input node, which results in a voltage level transition at the output node, which results in a feedback signal that the second control means uses to turn off the second output means. A low leakage keeper circuit maintains a logic zero at the output node upon the second output means turning OFF.

Another embodiment of the present invention is a reduced leakage logic circuit having a logic input, a logic output and a low leakage logic path. The low leakage logic path has a first node connected to the logic input and a second node coupled to the logic output. The circuit includes a NOR gate with one input coupled to the first node, one input coupled to the second note, and an output coupled to an inverter. The circuit includes a first driver with an input connected to the output of the inverter. The first driver is coupled to the logic output and supplies a voltage level representing logic one to the logic output when the first driver is turned ON. The circuit further includes a NAND gate with an input coupled to the first node and an input coupled to the second node. The circuit includes a second inverter having an input connected to the output of the NAND gate. The output of the second inverter is connected to a second driver. The second driver provides a logic zero to the output node when the second driver is turned ON. In one embodiment, the first driver has higher leakage characteristics than elements in the low leakage logic path.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention refer to the following descriptions taken in conjunction with the accompanying drawings, in which.

DETAILED DESCRIPTION

Figure 1:
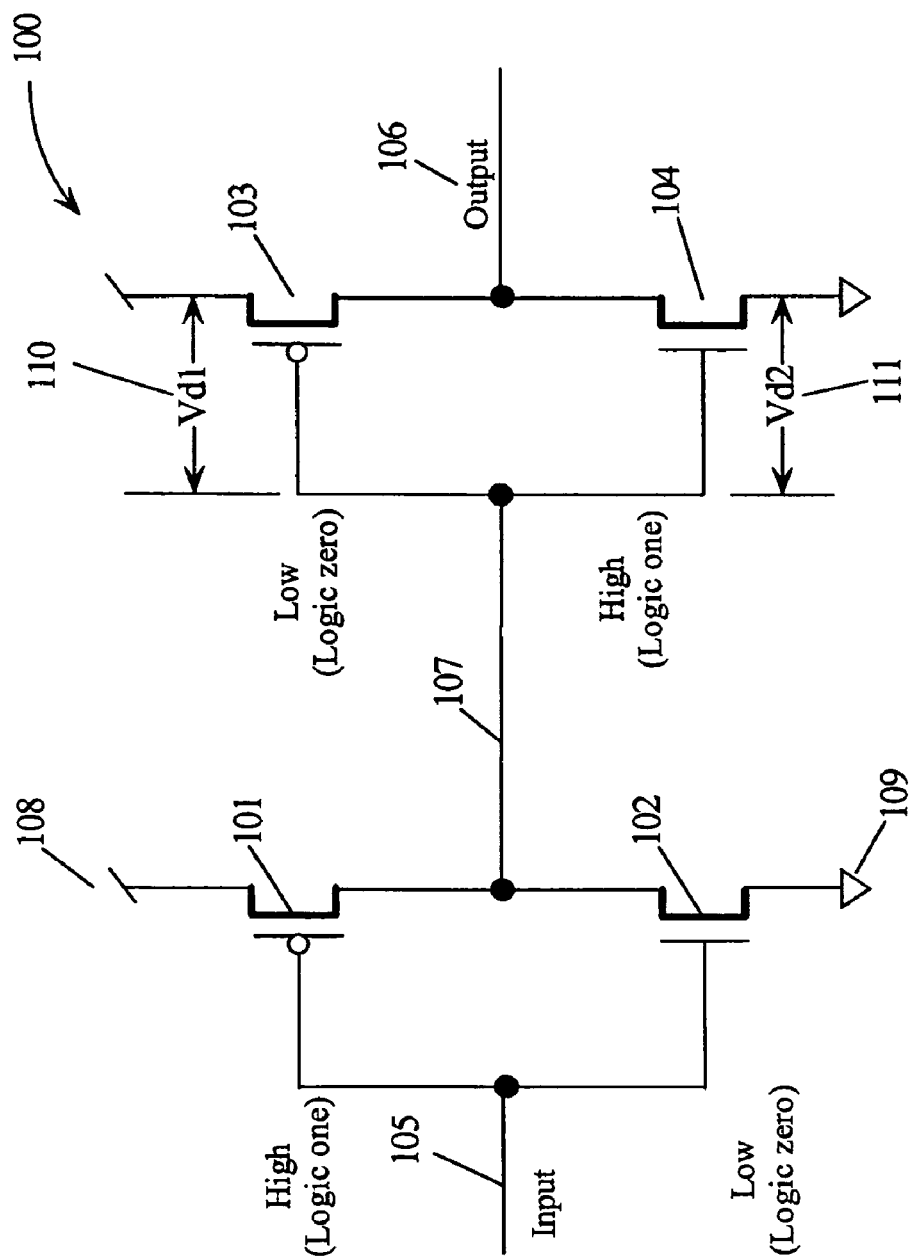
FIG. 1 is a circuit diagram of a prior art buffer illustrating the normal voltage stress that leads to leakage currents.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing and the like have been omitted inasmuch as such details are not necessary to obtain a complete understanding of the present invention and are within the skills of persons of ordinary skill in the relevant art.

In the following detailed description, a logic state refers to a voltage potential representing a binary value that a node, input, or output may experience. For example, a logic zero state could be the binary value corresponding to the ground voltage potential of the power supply and a logic one state could be the binary value corresponding to the positive voltage potential of the power supply powering logic circuitry. An asserted logic state at a node is a binary value that results from a switching device directly or indirectly coupling the node to either the positive or ground potentials of the power supply. An asserted logic state may be differentiated from a collapsing logic state which is a binary value that results from removing any direct drive of a node and allowing the node to either be charged or discharged (floated) to the binary value through leakage current. For example, if a PFET is turned OFF, its drain would tend to float to a logic one due to leakage. Likewise, if a NFET is turned OFF, its drain would tend to float to a logic zero due to leakage. Thus, an asserted logic zero would float "up" towards a logic one when the ground potential is decoupled from the device asserting the logic zero. If a collapsing logic zero is coupled to a device initially asserting a logic one, then it may cause a collapsing logic one on the output of the stage receiving the collapsing logic zero. A collapsing logic zero may be represented by the symbol L↑. Likewise, a collapsing logic one may be represented by the symbol H↓.

An embodiment of the present invention asserts a state at particular node within a control circuit to reduce the time that it might otherwise take for the state of the node collapse through leakage. By using asserted states within the control circuit rather using floating states that rely on leakage, drive elements may be turned off faster and overall leakage in a circuit may be reduced.

Refer now to the drawings wherein depicted elements are not necessarily shown to scale and wherein similar elements may be designated by the same reference numeral through the several views.

FIG. 1 is a circuit diagram of a prior art non-inverting buffer 100 comprising two inverting stages. Buffer 100 is coupled to positive power supply potential (Vdd) 108 and negative or ground power supply potential 109. The devices are powered by ground potential 109 and power supply 108. In some cases, just the circuit symbols for the potentials of 108 and 109 are shown. When input 105 is a logic one, PFET 101 is OFF and NFET 102 is ON. Intermediate node 107 is a logic zero. When node 107 is a logic zero, voltage Vd1 110 develops across the source to gate of PFET 103. PFET 103 is in the strong inversion region where it will exhibit its highest gate-leakage current. Vd1 110 is very nearly equal to the supply voltage differing only by the magnitude of the voltage across NFET 102 when it is ON. Likewise, when input 105 is a logic zero, PFET 101 is ON and charges node 107 to a logic one which generates Vd2 111 across the gate and source of NFET 104. When node 107 is a logic one, NFET 102 is in the strong inversion region and will exhibit its highest gate-leakage current. Again, Vd2 111 is very nearly equal to Vdd 108. In a normal buffer design, buffer 100 would employ larger devices for PFET 103 and NFET 104 because these stages provide the output drive capabilities. PFET 101 and NFET 102 both alternatively operate in the strong inversion region; however, as smaller devices, they exhibit lower gate-leakage than PFET 103 and NFET 104.

Figure 2:
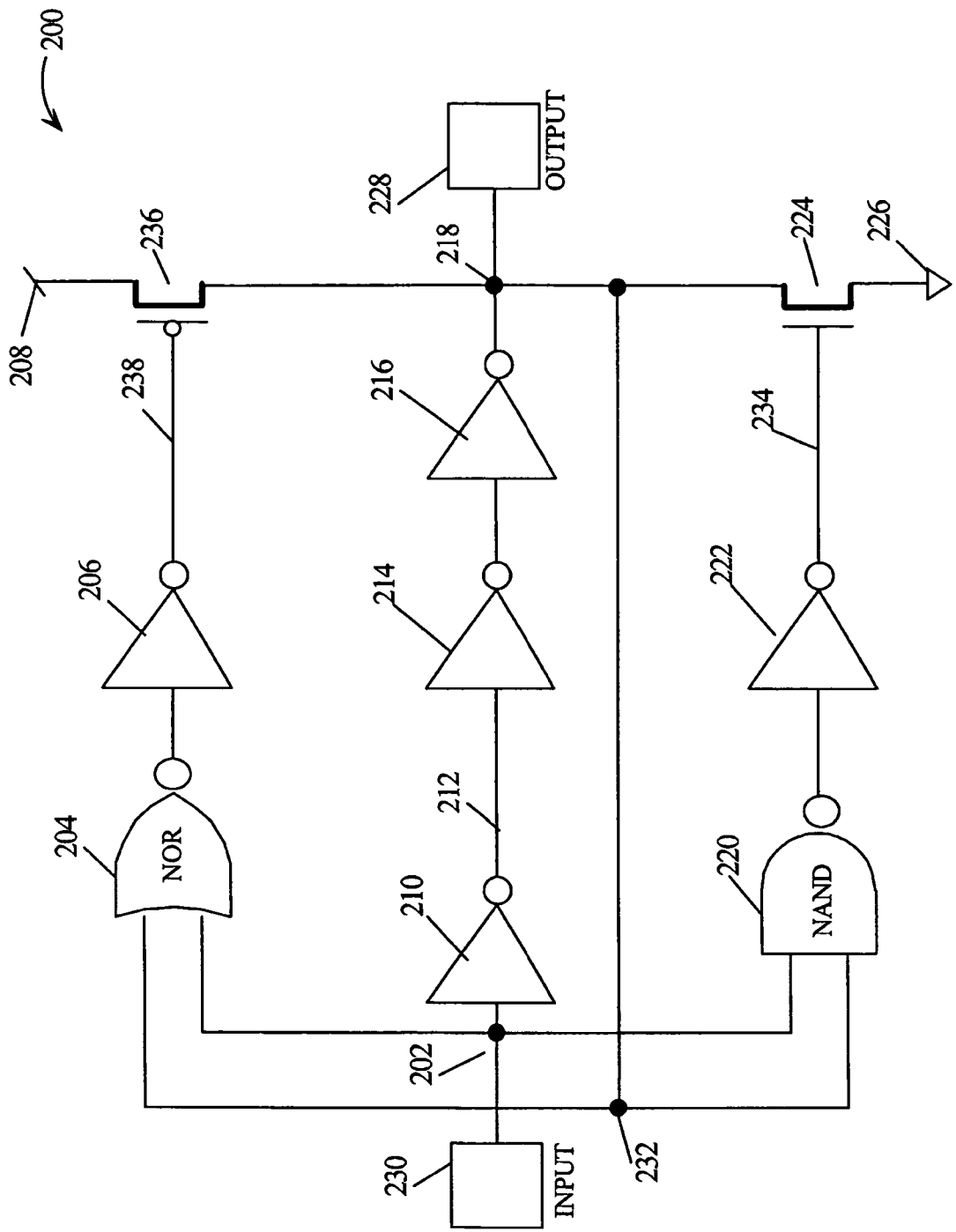
FIG. 2 is a circuit diagram of an inverting buffer utilizing NOR gates and NAND gates in accordance with an embodiment of the present invention.

FIG. 2 is a circuit diagram of an inverting buffer 200 which is an embodiment of the present invention. Low leakage inverters 210, 214, 216, form the low leakage logic path from input 230 to output 228 and function as a keeper means for output 228. A "keeper" can be any such low-leakage circuit or combination of circuit elements for holding an output state at logic one or logic zero. A keeper could be comprised of one or more small FET devices with reduced gate leakage when operated in the strong inversion region. PFET 236 acts as a drive means and provides enhanced current drive for the logic one state of output 228. Similarly, NFET 224 acts as a drive means and provides enhanced current drive for the logic zero state for output 228. PFET 236 and NFET 224 are large devices and have increased leakage current. NOR gate 204, inverter 206, the feedback signal on node 232, and the signal from node 202 act as a control means for controlling the drive means shown as PFET 236. Similarly, NAND gate 220, inverter 222, the feedback signal on node 232, and the signal from node 202 act as a control means for controlling the drive means shown as NFET 224

Analyzing circuit 200, NFET 224 is ON when node 234 is logic state one. Node 234 is logic state one when the output of NAND gate 220 is logic state zero. The output of NAND gate 220 is zero when both of the inputs for NAND gate 220 are logic state one. The inputs to NAND gate 220 are both at logic state one temporarily after the input 230 is at logic state zero, output 228 is at logic state one, and the input 230 changes to a logic state one. Upon input 230 changing to logic state one, both inputs to NAND 220 are logic state one. This results in a logic state zero at the input of inverter 222 and a logic state one at the gate of NFET 224. NFET 224 turns ON, and node 218 and output 228 are coupled to the voltage potential at node 226, shown as ground. The inputs to NAND gate 220 are both logic state one until node 218 becomes logic state zero. When node 218 becomes logic state zero, node 232 also becomes logic state zero, and the output of NAND gate 220 changes to logic state one. Consequently, the output of inverter 222 changes to logic state zero, and NFET 224 turns OFF. In this way, feedback to node 232 results in a fast turn-off circuit that propagates a turn-off signal from node 218, through node 232, through NAND 220, through inverter 222, and to the gate of NFET 224. The low leakage path comprising inverters 210, 214, and 216 acts as a keeper to maintain logic state one at node 218 and output 228 after driver 224 provides enhanced current drive.

Analyzing the portion of buffer 200 shown in the top of FIG. 2, PFET 236 is ON when node 238 is logic state zero. Node 238 is logic state zero when the output of NOR gate 204 is logic state one. The output of NOR gate 204 is logic state one when neither input to NOR gate 204 is logic state one. In other words, PFET 236 is ON when both inputs to NOR gate 204 are logic state zero. The inputs to NOR gate 204 are both logic state zero upon a change at node 202 from logic state one to logic state zero. If node 202 is at logic state one for an extended period, node 218 is at logic state zero, node 232 is at logic state zero, and one input of NOR gate 204 is at logic state zero. When node 202 changes to logic state zero, NOR gate 204 temporarily has logic state zero at both inputs, the output of NOR gate 204 changes to logic state one, the output of inverter 206 changes to logic state zero, and PFET 236 turns ON which charges node 218 with voltage 208. While PFET 236 is ON, it acts as a driving means for providing enhanced current to node 218 and output 228. Voltage 208 represents the voltage level at or near logic state one. Once node 218 and output 228 reach logic state one, node 232 also reaches logic state one, and NOR gate 204 outputs a logic state zero which propagates through inverter 206 as a logic state one and turns OFF PFET 236. The low leakage path comprising inverters 210, 214, and 216 acts as a keeper to maintain logic states at node 218 and output 228 after driver 236 provides enhanced current drive.

Figure 3:
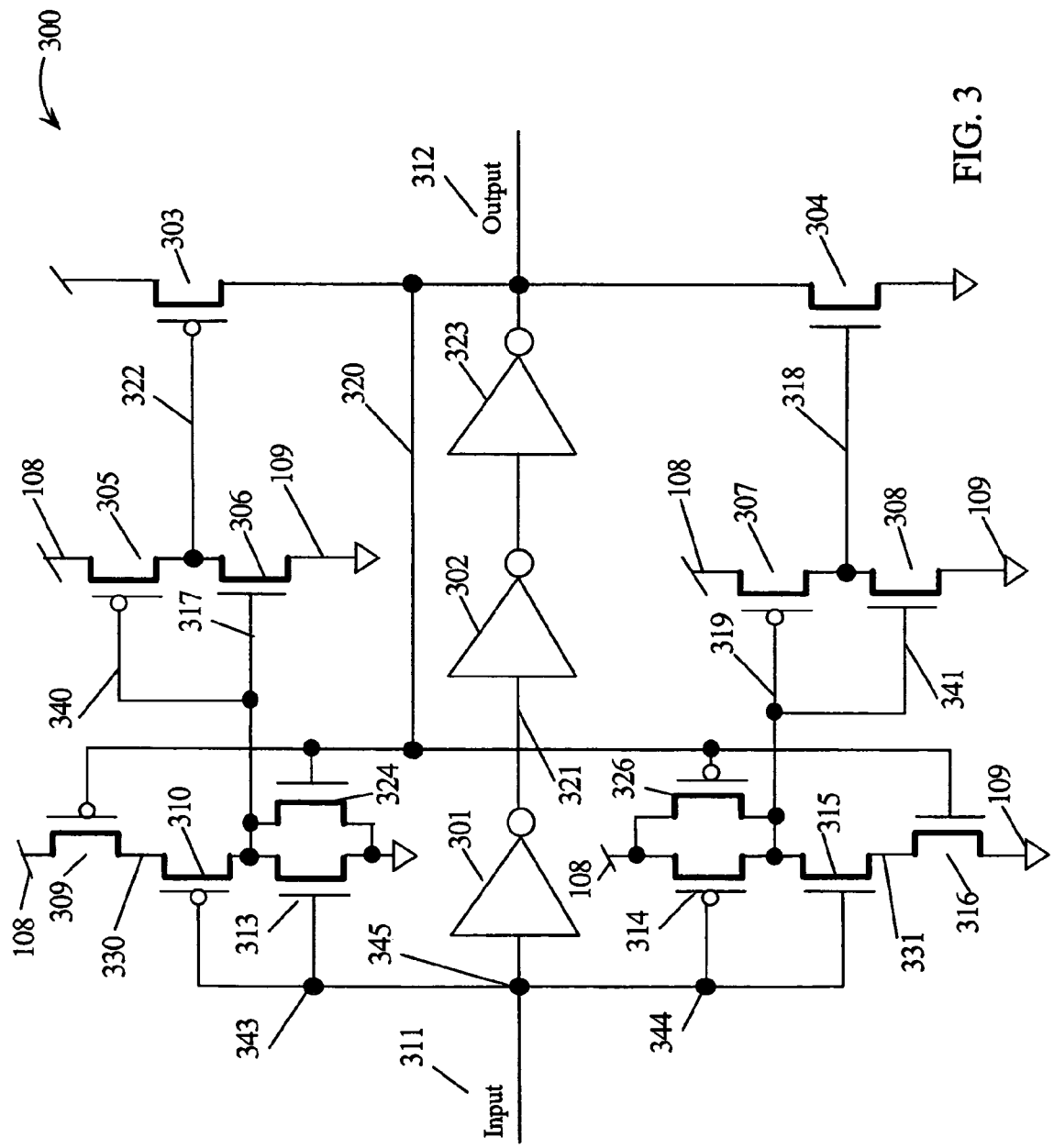
FIG. 3 is a circuit diagram of an inverting buffer utilizing CMOS transistors in accordance with an embodiment of the present invention.

FIG. 3 is a circuit diagram of an inverting buffer 300 that is an embodiment of the present invention. Low leakage inverters 301, 302, and 323 form a low leakage logic path from input 311 to output 312 and function as a keeper means for maintaining a particular logic state at output 312. PFET 303 is a driver means and provides enhanced current drive for the logic one state of output 312. Similarly, NFET 304 is a driver means and provides enhanced current drive for the logic zero state of output 312. PFET 303 and NFET 304 are large devices and, as such, have increased leakage current.

Buffer 300 employs control means with elements that provide fast turn-off of PFET 303 and NFET 304. A first control means includes PFETs 309, 310, 305 and NFETs 324, 313, 306 and associated nodes, connectors, supply voltages including feedback node 320 and rail voltage 108. A second control means includes PFETs 314, 326, 307 and NFETs 315, 316, and 308 and associated nodes, connectors, and supply voltages including feedback node 320 and ground potential 109. The first control means is a fast turn-off logic path and includes a power-gated circuit comprising PFETs 309–310, NFETs 313 and 324, an output coupled to stage node 317, a power gating input coupled to output 312, an inverting stage comprising PFET 305 and NFET 306 with an input coupled to stage node 317, and a driver stage comprising PFET 303. The second control means is a fast turn-off logic path and includes a power-gated circuit comprising NFETs 315–316, PFETs 314 and 326, an output coupled to stage node 319, an inverting stage comprising PFET 307 and NFET 308 with one input coupled to stage node 319, and a driver stage comprising NFET 304.

Analyzing buffer 300, assume that input 311 has been at a logic one state and the corresponding logic zero state is asserted on output 312. Feedback to node 320 couples the logic zero to the gates of PFET 309, NFET 324, NFET 316, and PFET 326. Therefore, PFET 309 is turned ON and the positive voltage potential 108 is coupled to the stage comprising PFET 310, NFET 313, and NFET 324. Likewise, NFET 316 is turned OFF which decouples the ground voltage potential from the stage comprising NFET 315, PFET 314, and PFET 326. NFET 324 is turned OFF and PFET 326 is turned ON, coupling voltage 108 to assert a logic one at node 319. Input 311 is coupled to the gates of NFETs 313 and 315 and PFETs 310 and 314. Therefore, NFET 313 is turned ON, pulling node 317 to a logic zero thus turning OFF NFET 306 and turning ON PFET 305. Since PFET 305 is ON, node 322 is logic one, and PFET 303 is OFF. Likewise, since output 312 and node 320 are a logic zero, NFET 316 is OFF. Since node 320 is logic zero, PFET 326 is ON, node 319 is logic one, PFET 307 is OFF and NFET 308 is ON. Since PFET 308 is ON, node 318 is logic zero, and NFET 304 is OFF. The logic zero on output 312 is held by low leakage inverters 301, 302, and 323, which act as a keeper means.

When input 311 transitions to a logic zero, since PFET 309 is ON (output 312 is still at a logic zero), the logic zero of input 311 turns PFET 310 ON, NFET 313 OFF, and therefore, node 317 transitions to a logic one turning ON NFET 306 and OFF PFET 305. Node 322 is pulled to a logic zero, turning ON drive PFET 303 to provide enhanced current drive. PFET 303 acts as an output means and provides enhanced current drive to output 312. Output 312 charges to a logic one with the enhanced current of drive PFET 303. The transition to a logic one by output 312 feeds back on node 320 and turns OFF PFET 309, decoupling the positive voltage potential 108 from the first stage. The logic one on node 320 turns on NFET 324 and drives node 317 to a logic zero, which then turns NFET 306 OFF and turns ON PFET 305. Note that, without NFET 324 driving node 317 to logic zero, the logic one at node 317 would be a collapsing logic one that would turn OFF NFET 306 over a delay period through low leakage. However, NFET 324 provides part of a fast turn off circuit for quickly driving the gates of NFET 306 and PFET 305 to logic zero to turn OFF NFET 306 and turn ON PFET 305. Node 322 is driven to logic one and PFET 303 is turned OFF. Inverters 301, 302 and 323 act as a keeper means and hold the logic one state on output 312 after PFET 303 is OFF.

When input 311 again transitions to a logic one, since NFET 316 is ON (output 312 is still at a logic one), the logic one on input 311 turns ON NFET 315 and node 319 transitions to a logic zero turning ON PFET 307 and turning OFF NFET 308. Since PFET 307 is ON, the positive voltage potential of node 108 is coupled to node 318, bringing node 318 to logic state one The logic one on node 318 turns ON drive NFET 304. NFET 304 acts as an output means and output 312 discharges to a logic zero with the enhanced current of drive NFET 304. The transition to a logic zero by output 312 feeds back and turns OFF NFET 316 resulting in a decoupling of the ground voltage potential 109. The logic zero on node 320 turns on PFET 326, which drives node 319 to logic one. With node 319 at logic one, PFET 307 turns OFF and NFET 308 turns ON. Therefore, node 318 is coupled to node 109 and node 318 becomes logic zero, removing the leakage stress on driver NFET 304. Inverters 301, 302 and 323, hold the logic zero state on output 312.

To increase the amount of delay from an asserted state on output 312 until the drive device (NFET 304 or PFET 303) is stressed relieved, a non-inverting stage may be added as a delay means in the feedback coupling between output 312 and node 320. For example, two inverters may be added between output 312 and node 320.

Figure 4:
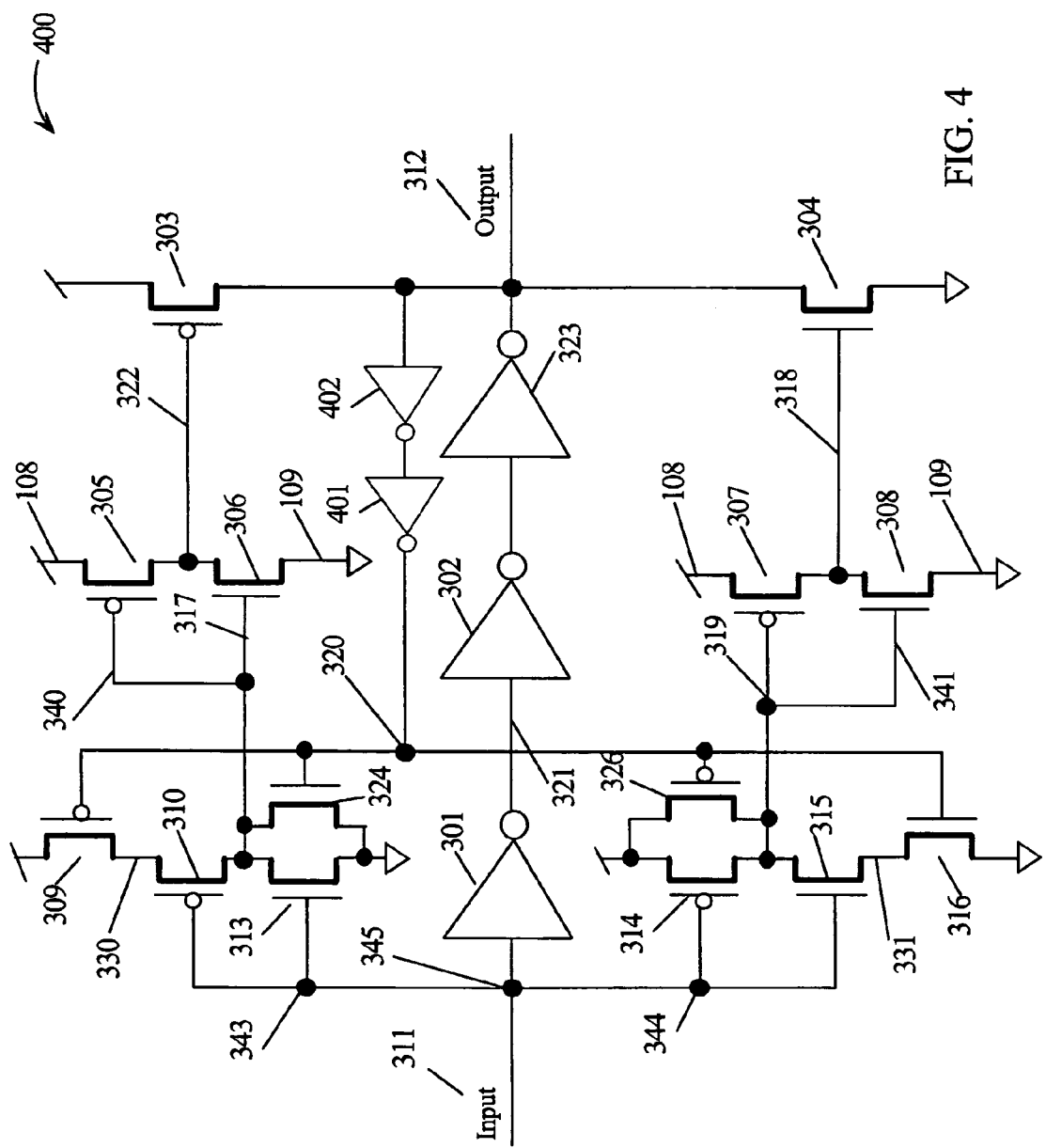
FIG. 4 is a circuit diagram of an inverting buffer with delay stages in a feedback loop in accordance with an embodiment of the present invention.

FIG. 4 illustrates the inverting drive of FIG. 3 with the addition of two inverters 401 and 402 inserted in the feedback path from output 312 to node 320. Inverters 401 and 402 acts as a delay means to increase the delay between an asserted state on output 312 and the relieving of leakage current stress from drive devices 303 and 304.

Figure 5:
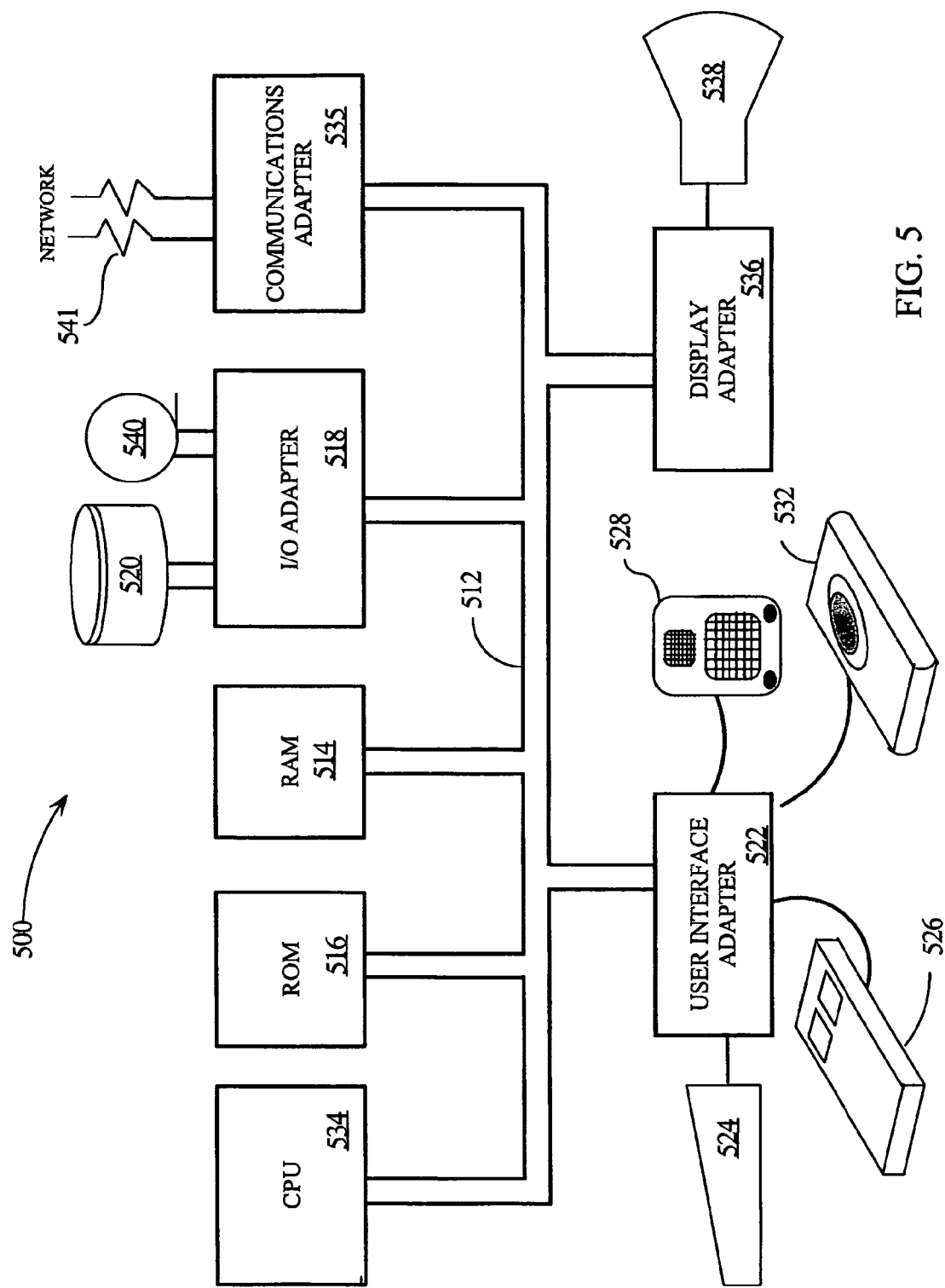
FIG. 5 is a block diagram of a data processing system suitable for practicing embodiments of the present invention.

FIG. 5 is a high level functional block diagram of a representative data processing system 500 suitable for practicing the principles of the present invention. Data processing system 500 includes a central processing system (CPU) 510 operating in conjunction with a system bus 512. System bus 512 operates in accordance with a standard bus protocol, such as the ISA protocol, compatible with CPU 510. CPU 510 operates in conjunction with electronically erasable programmable read-only memory (EEPROM) 516 and random access memory (RAM) 514. Among other things, EEPROM 516 supports storage of the Basic Input Output System (BIOS) data and recovery code. RAM 514 includes, DRAM (Dynamic Random Access Memory) system memory and SRAM (Static Random Access Memory) external cache. I/O Adapter 518 allows for an interconnection between the devices on system bus 512 and external peripherals, such as mass storage devices (e.g., a hard drive, floppy drive or CD/ROM drive), or a printer 540. A peripheral device 520 is, for example, coupled to a peripheral control interface (PCI) bus, and I/O adapter 518 therefore may be a PCI bus bridge. User interface adapter 522 couples various user input devices, such as a keyboard 524 or mouse 526 to the processing devices on bus 512. Display 538 which may be, for example, a cathode ray tube (CRT), liquid crystal display (LCD) or similar conventional display units. Display adapter 536 may include, among other things, a conventional display controller and frame buffer memory. Data processing system 500 may be selectively coupled to a computer or telecommunications network 541 through communications adapter 534. Communications adapter 534 may include, for example, a modem for connection to a telecom network and/or hardware and software for connecting to a computer network such as a local area network (LAN) or a wide area network (WAN). CPU 510 and other components of data processing system 500 may contain low leakage logic circuitry that is controlled with propagating collapsing logic states according to embodiments of the present invention to control gate-leakage currents.

Although the present invention and its advantages have been described in detail, it should be understood that various changes, substitutions and alterations can be made herein without departing from the spirit and scope of the invention as defined by the appended claims.

What is claimed is:

1. A buffer comprising:
   an input node for receiving a first input signal, wherein the input node comprises a voltage level, wherein the voltage level transitions between a logic one and a logic zero;
   first output means for providing enhanced current drive at an output node when the first output means is ON;
   a first control means for alternately turning the first output means ON and OFF, wherein the first control means is coupled to the input node, wherein the first control means turns the first output means ON in response to a voltage level transition at the input node, wherein the first control means turns the first output means OFF in response to a first feedback signal from the output node;
   a keeper means coupled to the input node and the output node for maintaining a logic one voltage level at the output node upon the turning OFF of the first output means, wherein the keeper means comprises one or more low-leakage inverters;
   a second output means for providing enhanced current drive at the output node when the second output means is ON; and
   a second control means for alternately turning the second output means ON and OFF, wherein the second control means is coupled to the input node, wherein the second control means turns the second output means ON in response to a voltage level transition at the input node, wherein the second control means turns the second output means OFF in response to a second feedback signal from the output node, wherein the first output means comprises a first PFET transistor that has higher leakage characteristics compared to the one or more low-leakage inverters of the keeper means.

2. The buffer of claim 1, wherein the second output means comprises a first NFET transistor that has higher leakage characteristics compared to the one or more low-leakage inverters of the keeper means.

3. The buffer of claim 1, wherein the first and second feedback signals propagate over a conductive path comprising one or more delay elements.

4. The buffer of claim 3, wherein the first control means comprises a first inverter, wherein an output of the first inverter is coupled to the gate of the first PFET transistor, wherein a power supply coupled to the first inverter can be power gated, wherein power gating the power supply to the first inverter causes the output of the first inverter to float.

5. The buffer of claim 4, wherein the second control means comprises a second inverter, wherein an output of the second inverter is coupled to the gate of the first NFET transistor, wherein a power supply coupled to the second inverter can be power gated, wherein power gating the power supply to the second inverter causes the output of the second inverter to float.

6. A reduced leakage logic circuit comprising:
   a logic input;
   a logic output;
   a low leakage logic path comprising a first node coupled to the logic input and a second node coupled to the logic output;
   a NOR gate comprising a NOR gate first input, a NOR gate second input, and a NOR gate output, wherein the NOR gate first input is coupled to the first node, wherein the NOR gate second input is coupled to the second node;
   a first inverter comprising a first inverter input and a first inverter output; wherein the first inverter input is coupled to the NOR gate output:
   a first driver comprising a first driver input, a first driver output, and a first driver supply voltage input, wherein the first driver input is coupled to the first inverter output, wherein the first driver supply voltage input is coupled to a first voltage level representing logic one, wherein the first driver output is coupled to the logic output and the second node;
   a NAND gate comprising a NAND gate first input, a NAND gate second input, and a NAND gate output, wherein the NAND gate first input is coupled to the first node, wherein the NAND gate second input is coupled to the second node;
   a second inverter comprising a second inverter input and a second inverter output, wherein the second inverter input is coupled to the NAND gate output; and
   a second driver comprising a second driver input, a second driver output, and a second driver voltage input, wherein the second driver voltage input is coupled to a second voltage level representing logic zero, wherein the second driver output is coupled to the logic output and the second node, wherein the second driver input is coupled to the second inverter output, wherein the low leakage logic path further comprises a third inverter, a fourth inverter, and a fifth inverter, wherein the third inverter comprises a third inverter input and a third inverter output, wherein the fourth inverter comprises a fourth inverter input and a fourth inverter output, wherein the fifth inverter comprises a fifth inverter input and a fifth inverter output, wherein the third inverter input is coupled to the first node, wherein the third inverter output is coupled to the fourth inverter input, wherein the fourth inverter output is coupled to the fifth inverter input, wherein the fifth inverter output is coupled to the second node.

7. The reduced leakage logic circuit of claim 6, wherein the first driver and the second driver are high-leakage devices compared to the third inverter, the fourth inverter, and the fifth inverter.

8. The reduced leakage logic circuit of claim 7, wherein the first driver provides enhanced current drive at the second node, wherein the voltage level of second node transitions to the first voltage potential representing logic one, wherein the NOR gate second input transitions to the first voltage potential representing logic one, wherein the NOR gate output transitions to the second voltage potential representing logic zero and the first driver turns OFF in response, wherein the low-leakage logic path maintains the first voltage level representing logic one at the second node.

9. The reduced leakage logic circuit of claim 8, wherein the second driver provides enhanced current drive at the second node, wherein the voltage level of the second node transitions to the second voltage potential representing logic zero, wherein the NAND gate second input transitions to the second voltage potential representing logic zero, wherein the NAND gate output transitions to the first voltage potential representing logic one and the second driver turns OFF in response, wherein the low-leakage logic path maintains the second voltage level representing logic zero at the second node.

10. A data processing system comprising a central processing unit (CPU) configured as one or more integrated circuits comprising a reduced leakage logic circuit, the reduced leakage logic circuit comprising:
   a logic input;
   a logic output;
   a low leakage logic path comprising a first node coupled to the logic input and a second node coupled to the logic output, wherein the low leakage logic path further comprises a third inverter, a fourth inverter, and a fifth inverter, wherein the third inverter comprises a third inverter input and a third inverter output, wherein the fourth inverter comprises a fourth inverter input and a fourth inverter output, wherein the fifth inverter comprises a fifth inverter input and a fifth inverter output, wherein the third inverter input is coupled to the first node, wherein the third inverter output is coupled to the fourth inverter input, wherein the fourth inverter output is coupled to the fifth inverter input, wherein the fifth inverter output is coupled to the second node;
   a NOR gate comprising a NOR gate first input, a NOR gate second input, and a NOR gate output, wherein the NOR gate first input is coupled to the first node, wherein the NOR gate second input is coupled to the second node;
   a first inverter comprising a first inverter input and a first inverter output, wherein the first inverter input is coupled to the NOR gate output;
   a first driver comprising a first driver input, a first driver output, and a first driver supply voltage input, wherein the first driver input is coupled to the first inverter output, wherein the first driver supply voltage input is coupled to a first voltage level representing logic one, wherein the first driver output is coupled to the logic output and the second node;
   a NAND gate comprising a NAND gate first input, a NAND gate second input, and a NAND gate output, wherein the NAND gate first input is coupled to the first node, wherein the NAND gate second input is coupled to the second node;
   a second inverter comprising a second inverter input and a second inverter output, wherein the second inverter input is coupled to the NAND gate output; and
   a second driver comprising a second driver input, a second driver output, and a second driver voltage input, wherein the second driver voltage input is coupled to a second voltage level representing logic zero, wherein the second driver output is coupled to the logic output and the second node, wherein the second driver input is coupled to the second inverter output, wherein the first driver and the second driver are high-leakage devices compared to the third inverter, the fourth inverter, and the fifth inverter.

11. The data processing system of claim 10, wherein the first driver provides enhanced current drive at the second node, wherein the voltage level of second node transitions to the first voltage potential representing logic one, wherein the NOR gate second input transitions to the first voltage potential representing logic one, wherein the NOR gate output transitions to the second voltage potential representing logic zero and the first driver turns OFF in response, wherein the low-leakage logic path maintains the first voltage level representing logic one at the second node.

12. The data processing system of claim 11, wherein the second driver provides enhanced current drive at the second node, wherein the voltage level of the second node transitions to the second voltage potential representing logic zero, wherein the NAND gate second input transitions to the second voltage potential representing logic zero, wherein the NAND gate output transitions to the first voltage potential representing logic one and the second driver turns OFF in response, wherein the low-leakage logic path maintains the second voltage level representing logic zero at the second node.

* * * * *